United States Patent [19]

Havassy

[11] Patent Number: 4,570,058

[45] Date of Patent: Feb. 11, 1986

[54] METHOD AND APPARATUS FOR AUTOMATICALLY HANDLING AND IDENTIFYING SEMICONDUCTOR WAFERS

[75] Inventor: Alan C. Havassy, Saylorsburg, Pa.

[73] Assignee: AT&T Technologies, Inc., Berkeley Heights, N.J.

[21] Appl. No.: 538,707

[22] Filed: Oct. 3, 1983

[51] Int. Cl.⁴ .............................................. G06K 13/04
[52] U.S. Cl. ................................. 235/479; 235/454; 235/383; 250/491.1
[58] Field of Search ............... 235/375, 454, 479, 485, 235/486, 464; 365/106; 356/426; 250/491.1

[56] References Cited

U.S. PATENT DOCUMENTS

| | | |
|---|---|---|
| 3,820,647 | 6/1974 | Waugh et al. |
| 3,865,254 | 2/1975 | Johannsmeier |
| 3,972,424 | 8/1976 | Levy et al. |
| 3,982,627 | 9/1976 | Isohata |
| 4,095,095 | 6/1978 | Muraoka et al. ..................... 235/375 |
| 4,166,574 | 9/1979 | Yokoyama .......................... 235/375 |
| 4,333,005 | 6/1982 | Takamatsu et al. ............ 235/464 X |
| 4,436,474 | 3/1984 | Brossman et al. ................... 414/417 |

Primary Examiner—David L. Trafton
Attorney, Agent, or Firm—M. M. de Picciotto; R. B. Levy

[57] ABSTRACT

Apparatus for automatically selecting a semiconductor wafer out of a wafer cassette, and identifying the selected wafer. The apparatus (10) comprises means for accessing a selected individual semiconductor wafer (11) out of a plurality of wafers within a cassette (12), an arm (27) coupled to the accessing means for lifting the selected wafer partially out of the cassette, and a driving member (33) contacting the edge of the selected wafer and rotating the wafer to expose a predetermined portion thereof. An optical reader (37) is positioned proximate to the driving member for identifying information stored in the predetermined portion of the wafer (FIG. 1).

7 Claims, 3 Drawing Figures

METHOD AND APPARATUS FOR AUTOMATICALLY HANDLING AND IDENTIFYING SEMICONDUCTOR WAFERS

TECHNICAL FIELD

The present invention relates to a method and an apparatus for handling disc-shaped articles and more particularly, to a method and an apparatus for automatically handling and identifying semiconductor wafers within a wafer cassette.

BACKGROUND OF THE INVENTION

In the semiconductor industry, disc-shaped semiconductor wafers form the basic medium for manufacturing electronic integrated circuits and devices. Typically, each wafer is subjected to a series of processing steps necessary to form tens of thousands of microelectronic devices. Thus, it becomes apparent that such wafers acquire considerable value as each processing step is performed. Since these wafers are fragile, and their features are delicate, the processing steps usually take place in a clean room environment to avoid particulate contamination of the wafers. The transport of the wafers in and out of such clean room, and between processing stations within the clean room, is typically achieved by using wafer carriers or cassettes capable of accommodating about 25 wafers, with each wafer held in a separate pocket in a substantial upright position.

In an effort to minimize damage and particulate contamination of the wafers and thereby achieve high manufacturing yields, operator handling of the wafers is being substantially avoided by resorting to automation. In an automated semiconductor wafer processing facility, it becomes essential to first identify each individual wafer of a cassette to verify that the correct wafers are in such cassette. Next, the identification of each wafer is required to insure that the appropriate processing steps associated with a particular wafer are indeed carried out on such wafer. Therefore, there exists a need for an apparatus capable of automatically handling and identifying without human intervention, any wafer within a cassette.

SUMMARY OF THE INVENTION

The foregoing need is met in an illustrative embodiment of the present invention wherein an apparatus for automatically identifying a semiconductor wafer—having identifying indicia on a portion thereof—out of a plurality of wafers within a wafer cassette comprises: means for accessing a selected wafer out of the plurality of wafers; an arm coupled to the accessing means for lifting the selected wafer out of the wafer cassette from a first position to a second position; a driving member positioned in spaced relation to the arm and adapted to engage the edge of the selected wafer in its second position; and means coupled to the driving member for rotating the selected wafer in its second position thereby exposing the portion having the indicia thereon. The apparatus further comprises optical means positioned proximate to the driving member for reading the identifying indicia on the exposed portion of the selected wafer.

BRIEF DESCRIPTION OF THE DRAWINGS

FIG. 3 1s an elevation view of the apparatus of FIG. 1.

DETAILED DESCRIPTION

Figure 1:
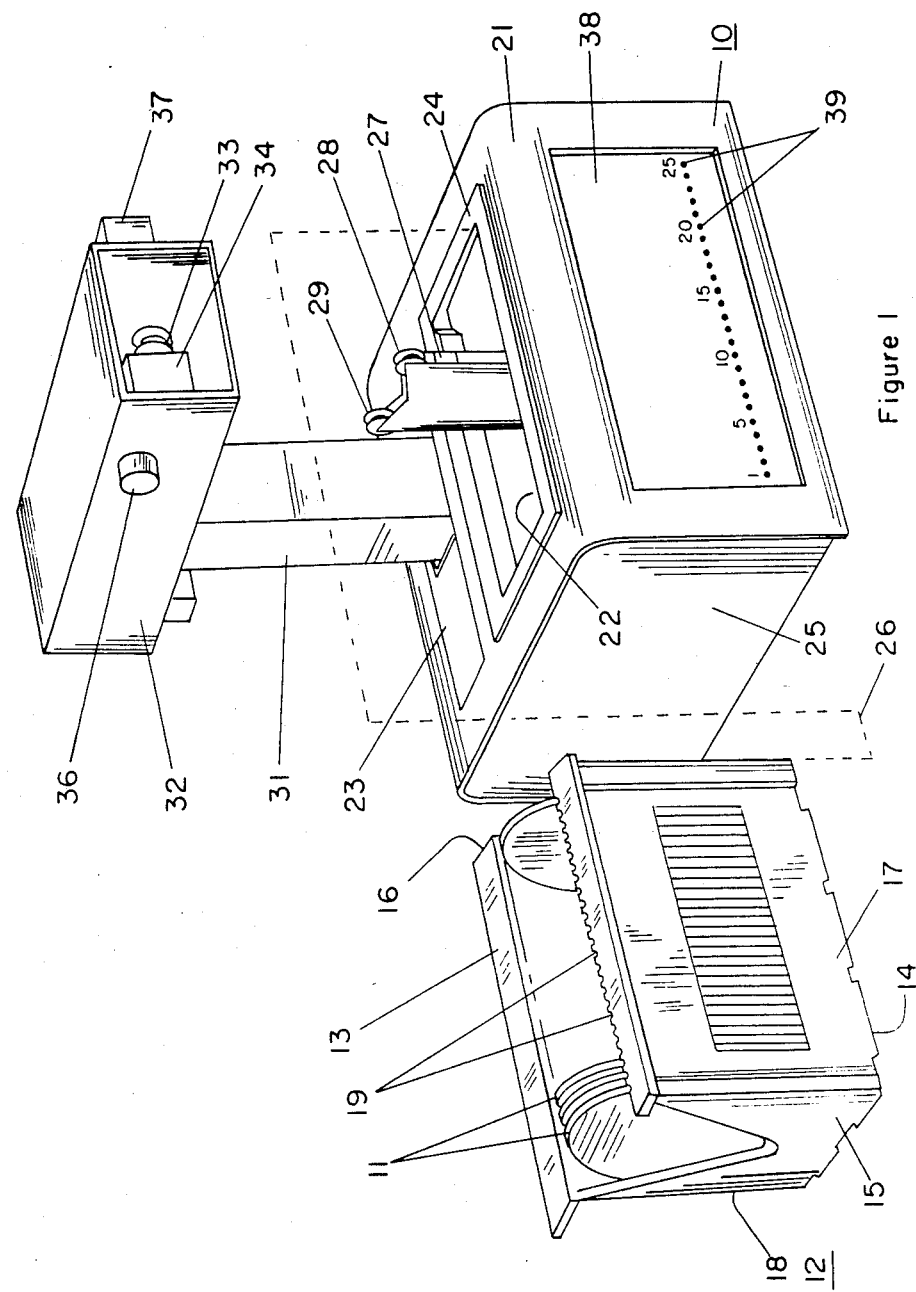
FIG. 1 is a perspective view of an apparatus in accordance with an illustrative embodiment of the present invention.

Shown in FIG. 1 is a perspective view of an apparatus 10 for automatically identifying a semiconductor wafer out of a plurality of wafers 11 within a wafer cassette 12. The wafers 11, which form the basic medium from which a plurality of integrated circuits and electronic devices may be made, are known to vary in size from less than 25 mm in diameter to about 125 mm in diameter with thicknesses ranging from less than 0.4 mm to about 0.6 mm. Such wafers 11 are typically cut from an essentially right cylindrical crystal in a direction normal to its longitudinal axis. These thin disc-shaped wafers 11 can be easily scratched and thus must be handled with great care to avoid any damage thereto. Generally, these wafers are supported on edge within a cassette with their major surfaces oriented in a substantial vertical position to facilitate access by solutions and drainage during processing.

As shown in FIG. 1, the cassette 12 has a fully accessible open top portion 13, an open bottom portion 14, two substantially parallel end portions 15 and 16, and first and second sidewalls 17 and 18. The sidewalls 17 and 18 comprise a plurality of opposed slots 19 facing each other and forming therebetween a plurality of pockets, each pocket being adapted to receive an individual wafer 11. Typically, the cassette 12 will hold about twenty-five of the wafers 11 in its individual pockets. A commercially available cassette of the type described above is manufactured and sold by the FLUOROWARE ® Corporation of Chaska, Minn., under its model No. A72-39M-06.

The apparatus 10 comprises a base 21, of generally parallelepiped shape, having two openings 22 and 23 formed in the top surface thereof and two end plates of which only end plate 25 is shown. A frame 24, positioned within and around the periphery of the opening 22, is dimensioned to receive and retain the bottom portion 14 of the cassette 12 as schematically illustrated by directional arrow 26. Also shown within the opening 22 is an arm 27 having 2 pair of V-grooved idler rollers 28 and 29 adapted to support a wafer on its edge. The rollers 28 and 29 are preferably selected out of a material known to minimize particulate generation, such as Teflon ® manufactured and sold by the DuPont Corp.

The arm 27 is capable of moving "up" and "down" in the vertical direction in response to a control arrangement (not shown) housed within a body 31. The arm 27 as shown is in its "up" position. The housing body 31, positioned within the opening 23 of the base 21 is capable of being selectively moved along the horizontal direction of the apparatus 10. The arm 27 which is coupled to the control arrangement located within the housing body 31 is thus also capable of moving, with the housing body 31, along the horizontal direction of the apparatus 10.

Coupled to the top portion of the housing body 31 is a wafer rotation and identification arrangement 32. The wafer rotation and identification arrangement 32 comprises a driving mechanism including a V-grooved roller 33 adapted to engage the edge of a selected wafer 11. The roller 33 is coupled to a free-floating capstan 34 as well as to a driving motor 36. The roller 33 is selected out of a material that minimizes particulate generation, and at the same time exhibits a friction coefficient with the silicon wafer sufficient to rotate it. In an illustrative embodiment, the roller 33 is made of Teflon ® material with a rubber-type material on the bottom portion of the V groove. The arrangement 32 also comprises an optical reader 37 for identifying information coded on either one of the surfaces of a wafer 11. The V-grooved roller 33 is positioned within the arrangement 32 such that its groove is aligned with the grooves of the two idler rollers 28 and 29 of the arm 27. The three V-grooved rollers 28, 29 and 33 define a vertical plane coincident with the focal plane of the optical reader 37.

The horizontally movable portion of the apparatus 10 comprises the wafer rotation and identification arrangement 32, the housing body 31 and the arm 27. The position of the foregoing horizontally movable portion of the apparatus 10 along the horizontal direction thereof is indicated on a front display panel 38 of the base 21 by means of a plurality of light indicators 39. The latter may be labelled or numbered to indicate the corresponding position of an individual wafer 11 being selected out of the plurality of wafers within a cassette.

A typical mode of operation of the apparatus 10 may be described as follows: to start a wafer identification cycle, an operator places the cassette 12 with wafers 11 therein in the frame 24 of the base 21 and selects which wafer 11 out of all the wafers in the cassette 12 is to be accessed and identified. This selection is achieved by moving the horizontally movable portion of the apparatus 10—including the arm 27, the housing body 31, and the wafer rotation and identification arrangement 32—along the horizontal direction of the apparatus 10 until a desired wafer is reached and its corresponding light indicator 39 is lit on the display panel 38. Next, the selected wafer 11 is lifted out of the cassette 12 by the arm 27 which passes through the bottom portion 14 of the cassette between neighboring wafers (of the selected wafer) without touching them. The displacement of the arm 27 in the vertical direction is such that the selected wafer 11 is partially lifted out of the cassette 12 by a distance of about one third to one half of the diameter of the wafer. The V-grooved idler rollers 28 and 29 engage the edge of the selected wafer 11 and raise it partially out of the cassette 12. When the arm 27 is in its "up" position, the edge in the top portion of the selected wafer engages the motor-driven V-grooved roller 33.

The motor-driven, free-floating, capstan driving mechanism can be adjusted so that it aligns a wafer in a predetermined position or it rotates it continuously. The optical reader 37 may be of a type including a light source/reader head movable in a direction substantially parallel to the plane of the wafer and capable of scanning a coded information inscribed on the exposed stationary portion of the wafer 11. In accordance with another embodiment, both the optical reader 37 and the exposed portion of the wafer 11 may be stationary and the coded information inscribed on the exposed portion is read. Alternatively, the optical reader 37 may include a stationary light source/reader head with the coded information inscribed on the surface of the wafer 11 continuously rotating past the reader head. In either one of these cases, the selected wafer 11, when lifted or raised out of the cassette 12, is maintained substantially in the focal plane of the head of the reader 37 since it rests proximate to the bottom of all three grooves of rollers 28, 29 and 33.

After the identification of the selected wafer is completed by the optical reader 37, the arm 27 is lowered to its "down" position. The apparatus 10 is now ready to access and identify another wafer within the cassette 12 by repeating the above-described cycle.

Structural details of various portions of the apparatus 10 will now be described in connection with FIGS. 2 and 3. Shown in FIG. 2, which illustrates a partial cross-sectional side view of the apparatus 10, is a carrier member 41 positioned within the base 21 and attached to the housing body 31 and the arm 27. The carrier member 41 comprises a generally vertical supporting body 42 and a horizontal plate 43 attached on top of the supporting body 42 in a direction substantailly perpendicular thereto. Attached to the plate 43 of the carrier member 41 is an arm positioning control arrangement 44 housed within the body 31 and selectively moving the arm 27 in the "up" or "down" position. Illustratively, the arm positioning control arrangement 44 comprises a pneumatically energized cylinder attached to the plate 43 and a reciprocating shaft 46 attached to a supporting portion 47 of the arm 27. Alternatively, other selectively energizable positioning means capable of moving between a first and a second position may be used instead of the pneumatically energized cylinder.

Figure 2:
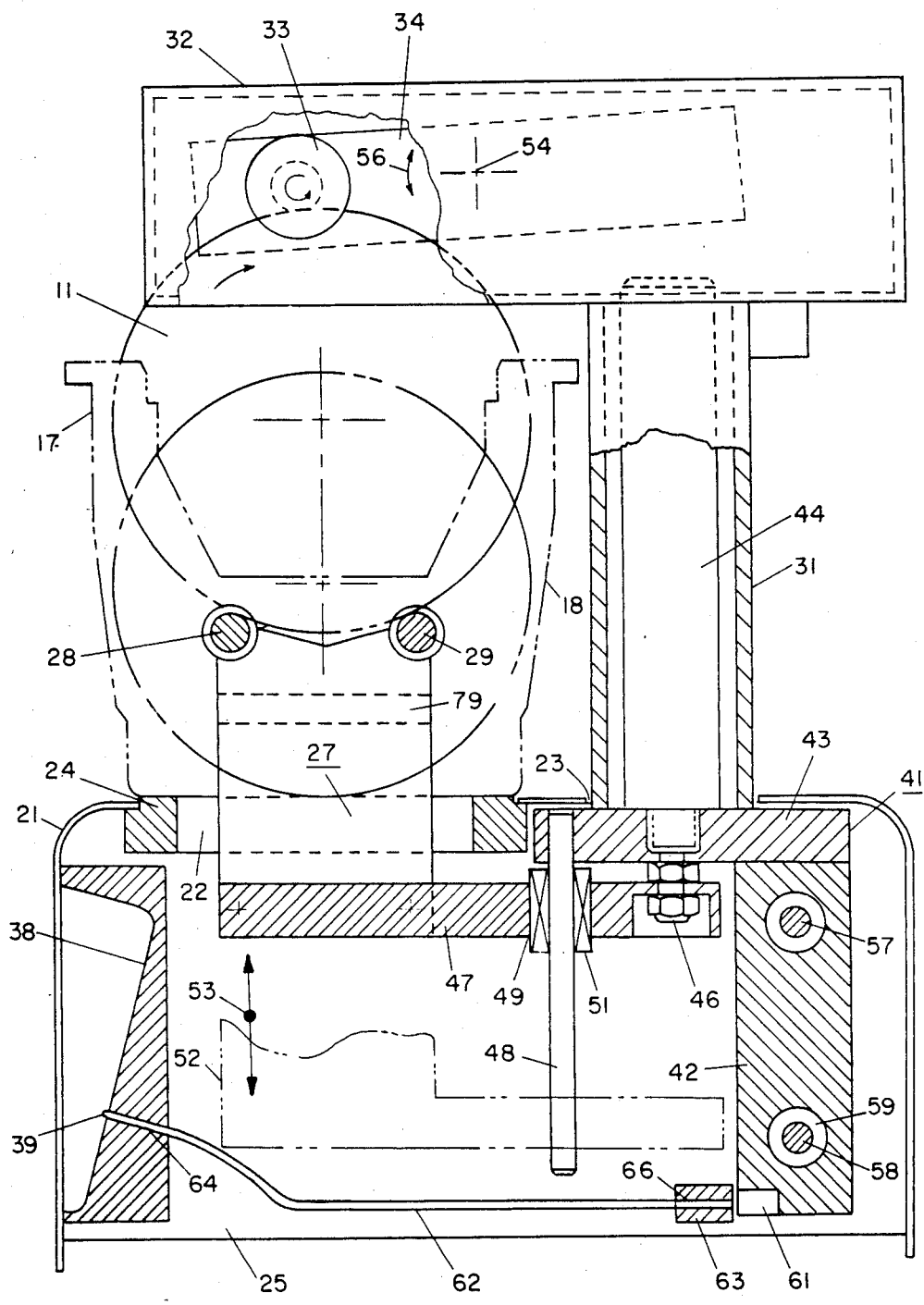
FIG. 2 is a side view partially in cross-section of the apparatus of FIG. 1.

In order to maintain the arm 27 and its supporting portion 47 in a substantially vertical plane, i.e., in the plane of FIG. 2 of the drawing, a guiding member 48 is attached to the plate 43 of the carrier 41. The guiding member 48 passes through an opening 49 in the supporting portion 47. Preferably, a cylindrical lining 51, such as a commercially available Thomson ball type bushing, is located in the opening 49 around the guiding member 48 to ease the vertical movement of the arm 27 between its two positions. As shown, the reciprocating shaft 46 of the control arrangement 44 is in a retracted position and the arm 27, attached thereto via the supporting portion 47, is in its "up" position. The other or "down" position of the arm 27 is illustratively shown by broken line 52 with bidirectional arrow 53 indicative of the direction of movement of the supporting portion 47. The displacement of the arm 27 in the vertical direction is of the order of one third to one half the diameter of the wafer 11. As mentioned above, the V-grooved rollers 28 and 29 of the arm 27 engage the lower edge portion of a wafer 11 when the arm 27 is moved from its "down" to its "up" position. In the latter, the upper edge portion of the wafer 11 engages the motor driven V-grooved roller 33. The roller 33 is supported by the free-floating capstan 34 which can pivot about its mounting axis 54 as schematically illustrated by bidirectional arrow 56. The optical reader 37 of the wafer rotation and identification arrangement 32 has been cut out of FIG. 2 to better illustrate the capstan/roller combination.

As mentioned above, the carrier member 41 is selectively movable along the horizontal direction of the apparatus 10, i.e., along a direction perpendicular to the plane of FIG. 2. Coupled to the supporting body 42 of the carrier member 41 is a carrier moving lead screw mechanism 57 capable of selectively moving the carrier member 41 to a preselected position along the horizontal direction of the apparatus 10. A guiding rod 58 and bearing 59 combination is also coupled to the supporting body 42 for providing support and guidance during the horizontal movements of the carrier member 41. Details of the moving mechanism 57 and the rod/bearing combination 58,59 will be described in connection with FIG. 3.

The position of the horizontally movable portion of the apparatus 10—consisting of the carrier member 41, the arm 27, the housing body 31, and the wafer rotation and identification arrangement 32—is indicated on the front display panel 38 of the apparatus 10 by one lighted indicator out of the plurality of light indicators 39—39. The lighting of an indicator 39 of the display panel 38 may be achieved by coupling a light source 61 to a portion of the carrier member 41 and positioning a plurality of light transmitting media (such as 62) between the light indicators 39—39 and a holding member 63. The latter is positioned proximate to the light source 61 and extends in the horizontal direction of the apparatus 10 between one end plate 25 and the other end plate (not shown) thereof. Preferably, the light transmitting medium 62 is a thin commercially available optical fiber or a light tube having one end inserted in an aperture 64 of the display panel 38 and the other end inserted into an opening 66 of the holding member 63. The opening 66 is located proximate and opposite to the location of the light source 61 of the carrier member 41.

Figure 3:
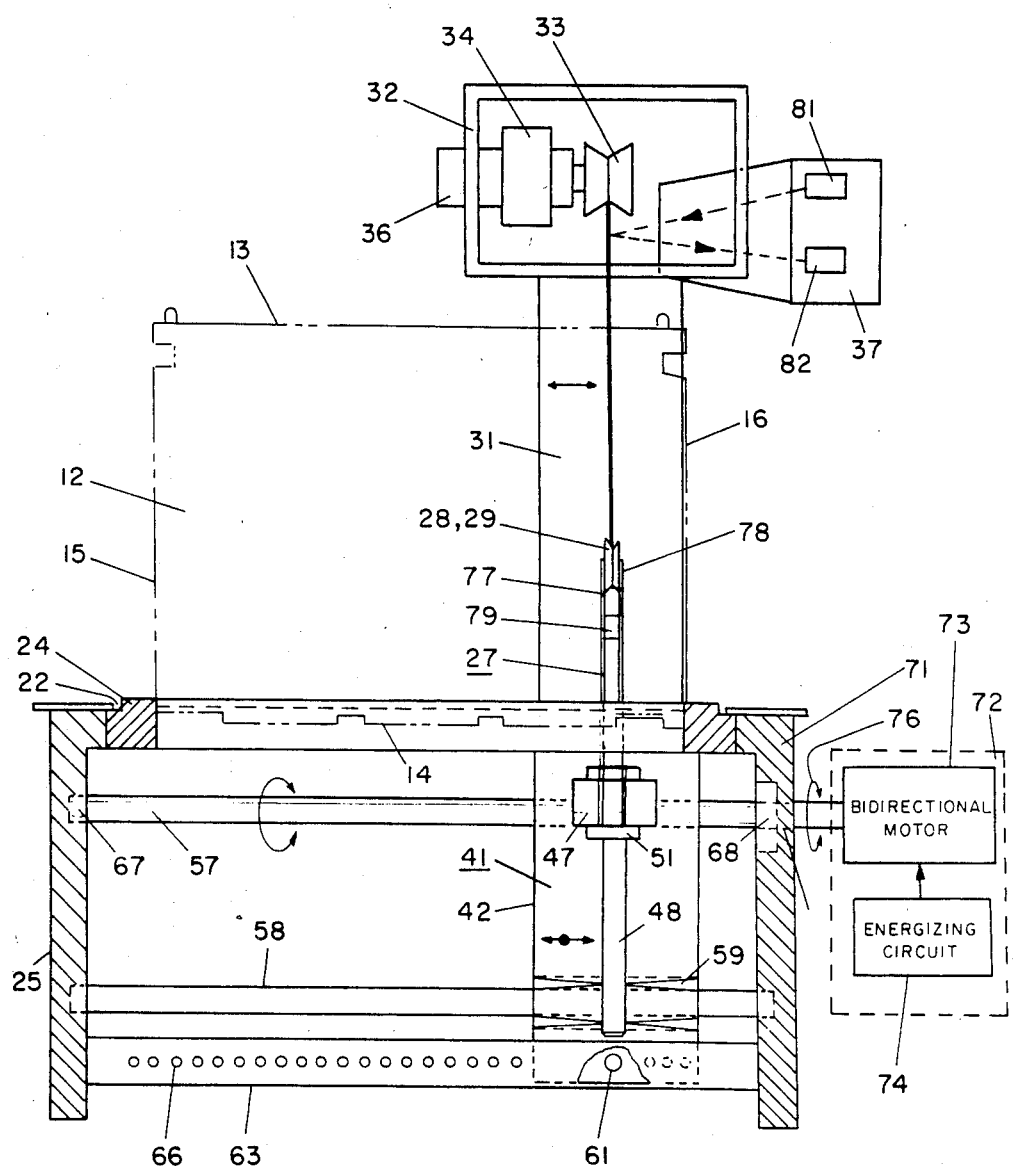

Shown in FIG. 3 is an elevation view, partially in cross-section, of the apparatus 10 of FIG. 1. The description of the various structural elements of the apparatus 10 already given in connection with FIGS. 1 and 2 of the drawings will not be reiterated. The mechanism for selectively moving the supporting body 42 of the carrier member 41 along the horizontal direction of the apparatus 10 may comprise any arrangement capable of accurately transporting the carrier member between a plurality of positions along the horizontal direction, each position corresponding to one wafer position within the cassette 12. The illustrative carrier moving mechanism shown in FIG. 3 comprises a lead screw 57 extending along the horizontal direction of the apparatus 10 and coupled to the vertical supporting body 42 of the carrier 41. The lead screw 57 has one end portion 67 supported by the end plate 25 of the apparatus 10. The other end portion 68 of the lead screw 57 passes through an opening 69 in the other end plate 71 of the apparatus 10. The end portion 68 of the lead screw 57 is coupled to an arm positioning control arrangement 72. The latter may comprise a bidirectional motor 73 coupled to lead screw 57, and a motor energizing circuit 74 capable of selectively controlling the rotation of the motor 73 in one or the other direction of rotation as illustrated by bidirectional arrow 76.

Alternatively, the arm positioning control arrangement 72 may comprise a handle (not shown) coupled to the lead screw 57 and activated by an operator. However, other means for selectively moving the carrier member 41 along the horizontal direction of the apparatus 10 may be used without departing from the spirit and scope of the invention. Such other moving means may include another mechanism capable of transforming a rotation movement to a translation movement (e.g., a motor coupled to a driving belt which is attached to the carrier member), or a linear translation mechanism (e.g., a bidirectional stepping motor having its reciprocating axle secured to the carrier member).

The arm 27, as shown in FIG. 3, comprises two substantially parallel thin plates 77 and 78 secured to the arm supporting portion 47 (as schematically illustrated in FIG. 2) with a spacer 79 positioned between the two plates 77 and 78. The two V-grooved idler rollers 28 and 29 are mounted between the two plates 77 and 78.

The optical reader 37 which is attached to the wafer rotation and identification arrangement 32 comprises a light source 81 and an optical detector 82. The positioning of the optical reader 37 relative to the three V-grooved roller 33 is such that the focal plane of optical reader 32 is substantially coincident with the wafer plane defined by the grooves of the three V-grooved rollers 28, 29 and 33.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. An apparatus for automatically identifying a semiconductor wafer, having identifying indicia on a portion thereof, out of a plurality of wafers within a wafer cassette comprising:
   means for accessing a selected wafer out of said plurality of wafers;
   an arm coupled to said accessing means for rotatably supporting the selected wafer while lifting it out of the wafer cassette from a first position to a second position;
   a driving member positioned in spaced relation to said arm and adapted to engage the edge of the selected wafer in its said second position; and
   means coupled to said driving member for rotating the selected wafer in its said second position thereby exposing the portion having the indicia thereon.

2. An apparatus according to claim 1 further comprising optical means positioned proximate to said driving member for reading the identifying indicia on the exposed portion of the selected wafer.

3. An apparatus according to claim 1, wherein the accessing means comprise:
   a carrier member selectively movable substantially along a first direction of the apparatus; and
   means attached to said carrier member and having a reciprocating member coupled to said arm for displacing said arm in a second direction substantially orthogonal to said first direction.

4. An apparatus according to claim 3, wherein said arm comprises a first and a second V-grooved idler roller for rotatably supporting a selected wafer on its edge, and wherein said driving member comprises a third V-grooved roller adapted to engage the edge of the selected wafer, whereby said three V-grooved rollers define a wafer plane parallel to said second direction and substantially coincident with the focal plane of the optical reading means.

5. A method for automatically identifying a semiconductor wafer, having identifying indicia on a portion thereof, out of a plurality of wafers within a wafer cassette comprising the steps of:
   accessing a selected wafer out of said plurality of wafers;
   coupling an arm to the edge of the accessed selected wafer;
   rotatably supporting the selected wafer while lifting it out of the wafer cassette from a first position to a second position by means of the arm;

engaging the edge of the selected wafer in its said second position in a driving member positioned in spaced relation to said arm; and rotating the selected wafer in its said second position to expose the portion having the identifying indicia thereon.

6. A method according to claim 5, further comprising the steps of:

positioning optical reading means proximate to the driving member; and reading the identifying indicia on the exposed portion of the selected wafer.

7. A method according to claim 6, wherein the rotating step comprises the step of continuously rotating the selected wafer past the optical reading means.

* * * * *